(12) United States Patent
Campbell et al.

(10) Patent No.: US 8,203,842 B2
(45) Date of Patent: Jun. 19, 2012

(54) OPEN FLOW COLD PLATE FOR IMMERSION-COOLED ELECTRONIC PACKAGES

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/985,562

(22) Filed: Jan. 6, 2011

(65) Prior Publication Data
US 2011/0103019 A1    May 5, 2011

Related U.S. Application Data (62) Division of application No. 12/256,605, filed on Oct. 23, 2008, now Pat. No. 7,916,483.

(51) Int. Cl.
*H05K 7/20* (2006.01)
*F28F 7/00* (2006.01)

(52) U.S. Cl. ........ 361/699; 165/80.4; 361/702; 361/711

(58) Field of Classification Search ............. 361/702
See application file for complete search history.

(56) References Cited

U.S. PATENT DOCUMENTS

| | | |
|---|---|---|
| 2,125,888 A | 8/1938 | Cordrey |
| 2,512,545 A | 6/1950 | Hazard |
| 2,548,325 A | 4/1951 | Smith |
| 2,643,282 A | 6/1953 | Green |
| 2,791,888 A | 5/1957 | Vani |
| 3,109,485 A | 11/1963 | Fortier |
| 3,143,592 A | 8/1964 | August |
| 3,226,941 A | 1/1966 | Snelling |
| 3,404,730 A | 10/1968 | Kurisu |
| 3,476,175 A | 11/1969 | Plevyak |

(Continued)

FOREIGN PATENT DOCUMENTS

DE    101 12 389 A1    10/2002

(Continued)

OTHER PUBLICATIONS

Notice of Allowance for U.S. Appl. No. 12/256,618 (U.S. Publication No. 2010/0101759 A1), dated Feb. 10, 2011.

(Continued)

*Primary Examiner* — Gregory Thompson
(74) *Attorney, Agent, or Firm* — Dennis Jung, Esq.; Kevin P. Radigan, Esq.; Heslin Rothenberg Farley & Mesiti P.C.

(57) ABSTRACT

A method and associated assembly are provided for cooling of a computing embodiment having electronic components. The heat generating components are disposed in the vicinity of at least one cold plate providing direct liquid cooling. Coolant is provided to the cold plate which will eventually exit it through one or more ports or orifices placed on the sides or both side and bottom of the cold plate. The placement, size and number of port(s) or orifice(s) can be selectively adjusted to control amount of coolant flow. Effluent flow from the cold plate flows over the remaining immersion cooled components and then exits the liquid tight enclosure which houses the electronic components.

20 Claims, 4 Drawing Sheets

U.S. PATENT DOCUMENTS

| | | |
|---|---|---|
| 3,512,582 A | 5/1970 | Chu et al. |
| 3,578,014 A | 5/1971 | Gachot |
| 3,586,101 A | 6/1971 | Chu et al. |
| 3,600,636 A | 8/1971 | Petersen |
| 3,609,991 A | 10/1971 | Chu et al. |
| 3,774,677 A | 11/1973 | Antonetti et al. |
| 3,858,909 A | 1/1975 | Friedman |
| 4,064,300 A | 12/1977 | Bhangu |
| 4,108,242 A | 8/1978 | Searight et al. |
| 4,201,195 A | 5/1980 | Sakhuja |
| 4,302,793 A | 11/1981 | Rohner |
| 4,430,866 A | 2/1984 | Willitts |
| 4,590,538 A | 5/1986 | Cray, Jr. |
| 4,619,316 A | 10/1986 | Nakayama et al. |
| 4,622,946 A | 11/1986 | Hurley et al. |
| 4,694,378 A | 9/1987 | Nakayama et al. |
| 4,704,658 A | 11/1987 | Yokouchi et al. |
| 4,741,385 A | 5/1988 | Bergles et al. |
| 4,750,086 A | 6/1988 | Mittal |
| 4,912,600 A | 3/1990 | Jaeger et al. |
| 4,928,206 A | 5/1990 | Porter et al. |
| 4,928,207 A * | 5/1990 | Chrysler et al. .............. 361/700 |
| 4,962,444 A | 10/1990 | Niggemann |
| 5,021,924 A | 6/1991 | Kieda et al. |
| 5,057,968 A | 10/1991 | Morrison |
| 5,063,476 A | 11/1991 | Hamadah et al. |
| 5,067,047 A | 11/1991 | Azar |
| 5,126,919 A | 6/1992 | Yamamoto et al. |
| 5,168,348 A | 12/1992 | Chu et al. |
| 5,183,104 A | 2/1993 | Novotny |
| 5,220,804 A | 6/1993 | Tilton et al. |
| 5,270,572 A | 12/1993 | Nakajima et al. |
| 5,274,530 A | 12/1993 | Anderson |
| 5,305,184 A | 4/1994 | Andresen et al. |
| 5,349,831 A | 9/1994 | Daikoku et al. |
| 5,406,807 A | 4/1995 | Ashlwake et al. |
| 5,414,592 A | 5/1995 | Stout et al. |
| 5,458,185 A * | 10/1995 | Mizuno ........................ 165/286 |
| 5,467,250 A | 11/1995 | Howard et al. |
| 5,491,363 A * | 2/1996 | Yoshikawa .................... 257/715 |
| 5,675,473 A | 10/1997 | McDunn et al. |
| 5,687,577 A | 11/1997 | Ballard et al. |
| 5,718,117 A | 2/1998 | McDunn et al. |
| 5,782,101 A | 7/1998 | Dennis |
| 5,825,621 A | 10/1998 | Giannatto et al. |
| 5,829,264 A | 11/1998 | Ishigaki et al. |
| 5,854,092 A | 12/1998 | Root et al. |
| 5,860,602 A | 1/1999 | Tilton et al. |
| 5,864,466 A | 1/1999 | Remsburg |
| 5,880,931 A | 3/1999 | Tilton et al. |
| 5,907,473 A | 5/1999 | Przilas et al. |
| 5,943,211 A | 8/1999 | Havey et al. |
| 5,959,351 A * | 9/1999 | Sasaki et al. .................. 257/714 |
| 5,970,731 A | 10/1999 | Hare et al. |
| 6,000,908 A | 12/1999 | Bunker |
| 6,016,969 A | 1/2000 | Tilton et al. |
| 6,019,167 A | 2/2000 | Bishop et al. |
| 6,026,565 A | 2/2000 | Giannatto et al. |
| 6,052,284 A | 4/2000 | Suga et al. |
| 6,055,157 A | 4/2000 | Bartilson |
| 6,139,361 A | 10/2000 | Przilas et al. |
| 6,173,577 B1 | 1/2001 | Gold |
| 6,193,905 B1 | 2/2001 | Yamada et al. |
| 6,205,799 B1 | 3/2001 | Patel et al. |
| 6,212,895 B1 | 4/2001 | Richardson |
| 6,243,268 B1 | 6/2001 | Kang et al. |
| 6,320,744 B1 | 11/2001 | Sullivan et al. |
| 6,349,554 B2 | 2/2002 | Patel et al. |
| 6,366,462 B1 | 4/2002 | Chu et al. |
| 6,378,605 B1 | 4/2002 | Kutcher et al. |
| 6,392,891 B1 | 5/2002 | Tzlil et al. |
| 6,393,853 B1 | 5/2002 | Vukovic et al. |
| 6,404,640 B1 | 6/2002 | Ishimine et al. |
| 6,431,260 B1 | 8/2002 | Agonafer et al. |
| 6,457,321 B1 | 10/2002 | Patel et al. |
| 6,462,941 B1 | 10/2002 | Hulick et al. |
| 6,519,151 B2 | 2/2003 | Chu et al. |
| 6,536,510 B2 | 3/2003 | Khrustalev et al. |
| 6,571,569 B1 | 6/2003 | Rini et al. |
| 6,574,104 B2 | 6/2003 | Patel et al. |
| 6,581,388 B2 | 6/2003 | Novotny et al. |
| 6,616,469 B2 | 9/2003 | Goodwin et al. |
| 6,621,707 B2 | 9/2003 | Ishimine et al. |
| 6,644,058 B2 | 11/2003 | Bash et al. |
| 6,646,879 B2 | 11/2003 | Pautsch |
| 6,708,515 B2 | 3/2004 | Malone et al. |
| 6,807,056 B2 | 10/2004 | Kondo et al. |
| 6,817,196 B2 | 11/2004 | Malone et al. |
| 6,828,675 B2 | 12/2004 | Memory et al. |
| 6,927,980 B2 | 8/2005 | Fukuda et al. |
| 6,955,062 B2 | 10/2005 | Tilton et al. |
| 6,973,801 B1 | 12/2005 | Campbell et al. |
| 6,976,528 B1 | 12/2005 | Tilton et al. |
| 7,011,143 B2 | 3/2006 | Corrado et al. |
| 7,012,807 B2 | 3/2006 | Chu et al. |
| 7,057,893 B2 | 6/2006 | Nicolai et al. |
| 7,079,393 B2 | 7/2006 | Colgan et al. |
| 7,088,585 B2 | 8/2006 | Chu et al. |
| 7,104,078 B2 | 9/2006 | Tilton |
| 7,106,590 B2 | 9/2006 | Chu et al. |
| 7,134,289 B2 | 11/2006 | Patel et al. |
| 7,143,605 B2 | 12/2006 | Rohrer et al. |
| 7,187,549 B2 | 3/2007 | Teneketges et al. |
| 7,191,954 B2 | 3/2007 | Kline |
| 7,222,502 B2 | 5/2007 | Kobayashi et al. |
| 7,233,491 B2 | 6/2007 | Faneuf et al. |
| 7,251,139 B2 | 7/2007 | Bhattacharya et al. |
| 7,252,100 B1 | 8/2007 | Downes et al. |
| 7,258,161 B2 | 8/2007 | Cosley et al. |
| 7,272,005 B2 | 9/2007 | Campbell et al. |
| 7,285,851 B1 | 10/2007 | Cepeda-Rizo et al. |
| 7,286,356 B2 | 10/2007 | Keenan et al. |
| 7,295,436 B2 | 11/2007 | Cheon |
| 7,295,440 B2 | 11/2007 | Ganev et al. |
| 7,309,209 B2 | 12/2007 | Amiot et al. |
| 7,349,213 B2 | 3/2008 | Campbell et al. |
| 7,355,852 B2 | 4/2008 | Pfahnl |
| 7,362,574 B2 | 4/2008 | Campbell et al. |
| 7,365,973 B2 | 4/2008 | Rasmussen et al. |
| 7,372,698 B1 | 5/2008 | Tilton et al. |
| 7,375,962 B2 | 5/2008 | Campbell et al. |
| 7,380,409 B2 | 6/2008 | Campbell et al. |
| 7,385,810 B2 | 6/2008 | Chu et al. |
| 7,392,660 B2 | 7/2008 | Tilton et al. |
| 7,392,823 B2 | 7/2008 | Dong et al. |
| 7,400,505 B2 | 7/2008 | Campbell et al. |
| 7,403,392 B2 | 7/2008 | Attlesey et al. |
| 7,408,776 B2 | 8/2008 | Campbell et al. |
| 7,414,845 B2 | 8/2008 | Attlesey et al. |
| 7,420,808 B2 | 9/2008 | Campbell et al. |
| 7,428,151 B2 | 9/2008 | Sonnabend et al. |
| 7,436,666 B1 * | 10/2008 | Konshak ....................... 361/699 |
| 7,450,384 B2 | 11/2008 | Tavassoli et al. |
| 7,450,385 B1 | 11/2008 | Campbell et al. |
| 7,466,549 B2 | 12/2008 | Dorrich et al. |
| 7,477,513 B1 | 1/2009 | Cader et al. |
| 7,477,514 B2 | 1/2009 | Campbell et al. |
| 7,495,914 B2 | 2/2009 | Tilton et al. |
| 7,531,142 B2 | 5/2009 | Huziwara et al. |
| 7,559,207 B2 | 7/2009 | Knight et al. |
| 7,561,425 B2 | 7/2009 | Mindock et al. |
| 7,602,608 B2 | 10/2009 | Tilton et al. |
| 7,609,518 B2 | 10/2009 | Hopton et al. |
| 7,630,795 B2 | 12/2009 | Campbell et al. |
| 7,639,499 B1 | 12/2009 | Campbell et al. |
| 7,641,101 B2 | 1/2010 | Campbell et al. |
| 7,654,100 B2 | 2/2010 | Rini et al. |
| 7,660,109 B2 | 2/2010 | Iyengar et al. |
| 7,661,463 B2 | 2/2010 | Liu |
| 7,724,524 B1 | 5/2010 | Campbell et al. |
| 2002/0062945 A1 | 5/2002 | Hocker et al. |
| 2003/0230401 A1 | 12/2003 | Pfister et al. |
| 2004/0008490 A1 | 1/2004 | Cheon |
| 2004/0057211 A1 | 3/2004 | Kondo et al. |
| 2005/0207116 A1 | 9/2005 | Yatskov et al. |
| 2005/0241802 A1 * | 11/2005 | Malone et al. ............... 165/80.4 |
| 2005/0244280 A1 | 11/2005 | Malone et al. |

| | | |
|---|---|---|
| 2005/0254214 A1 | 11/2005 | Salmon |
| 2006/0126296 A1 | 6/2006 | Campbell et al. |
| 2006/0162365 A1 | 7/2006 | Hoang et al. |
| 2006/0180300 A1 | 8/2006 | Lenehan et al. |
| 2007/0025081 A1 | 2/2007 | Berlin et al. |
| 2007/0035937 A1 | 2/2007 | Colbert et al. |
| 2007/0121295 A1 | 5/2007 | Campbell et al. |
| 2007/0159797 A1 | 7/2007 | Teneketges et al. |
| 2007/0193300 A1 | 8/2007 | Tilton et al. |
| 2007/0199204 A1 | 8/2007 | Knight et al. |
| 2007/0199340 A1 | 8/2007 | Knight et al. |
| 2007/0227710 A1 | 10/2007 | Belady et al. |
| 2007/0291452 A1 | 12/2007 | Gilliland et al. |
| 2007/0295480 A1 | 12/2007 | Campbell et al. |
| 2007/0297136 A1 | 12/2007 | Konshak |
| 2008/0002363 A1 | 1/2008 | Campbell et al. |
| 2008/0018212 A1 | 1/2008 | Spearing et al. |
| 2008/0024991 A1 | 1/2008 | Colbert et al. |
| 2008/0062639 A1 | 3/2008 | Campbell et al. |
| 2008/0123297 A1 | 5/2008 | Tilton et al. |
| 2008/0158818 A1 | 7/2008 | Clidaras et al. |
| 2008/0196868 A1 | 8/2008 | Attlesey et al. |
| 2008/0209931 A1 | 9/2008 | Stevens |
| 2008/0225478 A1 | 9/2008 | Goettert et al. |
| 2009/0080173 A1 | 3/2009 | Schmidt et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2009/0238235 A1 | 9/2009 | Campbell et al. |
| 2009/0260777 A1 | 10/2009 | Attlesey |
| 2009/0268404 A1 | 10/2009 | Chu et al. |
| 2009/0314467 A1 | 12/2009 | Campbell et al. |
| 2009/0316360 A1 | 12/2009 | Campbell et al. |
| 2010/0101759 A1 | 4/2010 | Campbell et al. |
| 2010/0101765 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |
| 2010/0246118 A1 | 9/2010 | Attlesey |

FOREIGN PATENT DOCUMENTS

| | | |
|---|---|---|
| JP | 8-254512 A | 10/1996 |
| JP | 2002-374086 | 12/2002 |
| WO | WO 2009/131810 A2 | 10/2009 |

OTHER PUBLICATIONS

RD 323064 A, Mar. 10, 1991.

Hwang, U., "Heat Exchanger for Vapor Condensation by Dropwise Technique", IBM Technical Disclosure Bulletin, Publication No. IPCOM000089717D (Dec. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed Jun. 25, 2009.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Adjusting Coolant Flow Resistance Through Liquid-Cooled Electronics Rack(s)", U.S. Appl. No. 12/556,040, filed Sep. 9, 2009.

Campbell et al., "Apparatus and Method with Forced Coolant Vapor Movement for Facilitating Two-Phase Cooling of an Electric Device", U.S. Appl. No. 12/565,175, filed Sep. 23, 2009.

Campbell et al., "Liquid-Cooled Electronics Apparatus and Methods of Fabrication", U.S. Appl. No. 12/556,081, filed Sep. 24, 2009.

Campbell et al., "Compliant Conduction Rail Assembly and Method Facilitating Cooling of an Electronics Structure", U.S. Appl. No. 12/570,215, filed on Sep. 30, 2009.

Campbell et al., "Cooled Electronic Module with Pump-Enhanced, Dielectric Fluid Immersion-Cooling", U.S. Appl. No. 12/491,281, filed Jun. 25, 2009.

Campbell et al., "System and Method for Standby Mode Cooling of a Liquid-Cooled Electronics Rack", U.S. Appl. No. 12/567,954, filed Sep. 28, 2009.

Campbell et al., "Cooling System and Method Minimizing Power Consumption in Cooling Liquid-Cooled Electronics Racks", U.S. Appl. No. 12/556,066, filed Sep. 9, 2009.

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

International Application No. PCT/EP2009/060792, filed Aug. 20, 2009. Notification of International Search Report, dated Dec. 23, 2009.

Office Action for U.S. Appl. No. 12/256,631 (U.S. Patent Publication No. 2010/0103614 A1), dated Apr. 21, 2010.

Office Action for U.S. Appl. No. 12/256,628 (U.S. Patent Publication No. 2010/0103618 A1), dated Aug. 5, 2010.

Office Action for U.S. Appl. No. 12/256,605 (U.S. Patent Publication No. 2010/0103620 A1), dated Aug. 10, 2010.

Office Action for U.S. Appl. No. 12/256,618 (U.S. Patent Publication No. 2010/0101759 A1), dated Aug. 30, 2010.

Office Action for U.S. Appl. No. 12,256,623 (U.S. Patent Publication No. 2010/0101765 A1), dated Nov. 5, 2010.

Campbell et al., Notice of Allowance for U.S. Appl. No. 12/825,756, filed Jun. 29, 2010 (U.S. Patent Publication No. 2011/0315355 A1), dated Jan. 13, 2012.

Campbell et al., Notice of Allowance for U.S. Appl. No. 12/825,781, filed Jun. 29, 2010 (U.S. Patent Publication No. 2011/0317367 A1), dated Jan. 20, 2012.

* cited by examiner

OPEN FLOW COLD PLATE FOR IMMERSION-COOLED ELECTRONIC PACKAGES

CROSS-REFERENCE TO RELATED APPLICATION

This application is a divisional of U.S. patent application Ser. No. 12/256,605, filed Oct. 31, 2008, entitled "Open Flow Cold Plate for Liquid Cooled Electronic Packages", by Campbell et al., which was published on Apr. 29, 2010, as U.S. Patent Publication No. 2010/0103620 A1, the entirety of which is hereby incorporated herein by reference.

BACKGROUND

This invention relates to cooling of computing system environments and more particularly to immersion cooling of electronic components used in large computing systems environments having one or more servers.

The industry trend has been to continuously increase the number of electronic components inside computing systems. Given the limited footprint of many computing systems, a continuous increase in the number of heat generating components creates challenging heat dissipation issues. These issues if not dealt with adequately can harm the structural and data integrity of the computer system, making the effect felt both at a system and module level.

Most electronic packages or nodes in large environments are housed in stacks disposed in frames that resemble racks or cages. Traditionally, these electronic packages have been cooled by forced air cooling using air moving devices, such as fans and blowers, selectively disposed somewhere in the environment as to allow optimum air flow. These air moving devices are often designed to displace hot air away from the components by creating parallel air flow paths that circulate through the rack or cage like frame or structure.

As the packaging densities increase, however, the air cooling solutions are becoming more prohibitive and costly. In addition, air cooling has other associated costs in the form of unwanted acoustic and energy consumption characteristics. In large data centers that house many computing environments in close proximity, the heat dissipation issue is exacerbated even more. In such cases, cooling costs and feasibility of providing air cooling have become a burden to many businesses that rely on their data centers.

Figure 1:
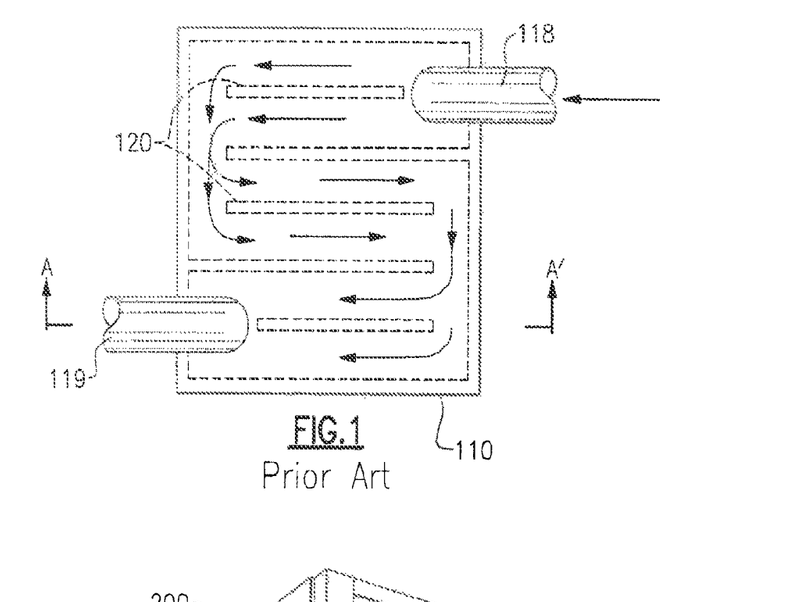
FIG. 1 is a top-down illustration of a prior art cold plate that dissipates heat from electronic components through indirect liquid cooling techniques.

In recent years, direct or indirect liquid cooling has become a more attractive option for the designers of computing systems. Liquid cooling has been shown to be substantially less burdensome both in terms of energy costs and resource allocations, especially for use in data centers. Prior art FIG. 1 is a top-down illustration of a conventional cold plate used for that employs indirect liquid cooling. Traditionally, as illustrated in FIG. 1, indirect liquid cooling techniques incorporate a conventional cold plate 110, disposed adjacent to a circuit module or chip (not shown). In this case, the cold plate 110 comprises a number of internal fins/ribs 120 and is attached to the back of the module or chip. Cooling liquid is provided inside the internal ribs or fins 120 of the cold plate from a coolant supply and circulated by entering a coolant inlet 118 and exiting through outlet port 119. Heat from the electronic components is conducted to the mating surface of the cold plate and then into the internal fins or ribs 120 from the surface of the cold plate and is in turn transferred to the cooling liquid by convection. In such arrangements, the coolant liquid would be completely sealed off from the electronic components and only used to provide indirect liquid cooling to the components.

Indirect liquid cooling reduces the need to use air cooling devices but does not provide a complete solution. In many instances, even when indirect liquid cooling methods have been implemented to cool high powered modules, the remainder of the system including the memory and other support modules are still air-cooled. At a data center level, even such partial air cooling represents a significant burden on businesses that incorporate such centers. Due to its drawbacks, in many instances indirect liquid cooling has been limited to cooling processor modules in conjunction with air cooling to dissipate heat from other electronic components. The present invention addresses these shortcomings by providing total liquid cooling techniques that can be used with all electronic components, including processor modules and others such as memory, power and other support modules.

BRIEF SUMMARY

The shortcomings of the prior art are overcome and additional advantages are provided through the provision of a method and associated assembly for cooling of a computing embodiment having electronic components. The heat generating components are disposed in the vicinity of at least one cold plate providing direct liquid cooling. Coolant is provided to the cold plate which will eventually exit it through one or more ports or orifices placed on the sides or both side and bottom of the cold plate. The placement, size and number of port(s) or orifice(s) can be selectively adjusted to control the amount of coolant flow. The cold plate can also be secured to the substrate via securing means. Stand-offs can also be provided to control the distance of the substrate from the cold plate.

In one embodiment, the apparatus comprises an open flow cold plate having a coolant conduit. The coolant conduit delivers coolants from a source to the cold plate. The cold plate having at least one orifice on a bottom surface and at least one port on a side surface of the cold plate such that coolant supplied to the cold plate can flow out of said cold plate through the side and bottom orifice to cool any electronic components disposed in the cold plate vicinity.

In another embodiment, the apparatus comprises an open flow cold plate having a coolant conduit. The coolant conduit is enabled to receive coolant from a supply and to deliver coolant into the cold plate when supplied. The cold plate also has a plurality of internal fins being cooled by said coolants. The cold plate has at least one effluent port on at least one side of said cold plate such that when coolant is provided it can exit the cold plate via said side ports.

In yet another embodiment, the different types of cold plate provided above can be combined. In this embodiment, a method of cooling electronic components can be provided comprising the following steps. First, a blade system having electronic components can be disposed in a liquid tight enclosure. At least one cold plate is also disposed in said liquid tight enclosure to provide cooling for said electronic components. Coolant will be provided to one or the plurality of cold plates by means of a coolant supply via a coolant conduit to the cold plate(s). The coolant flowing out of said cold plate unto said electronic components via at least one port disposed on a side surface of said cold plate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 2A:
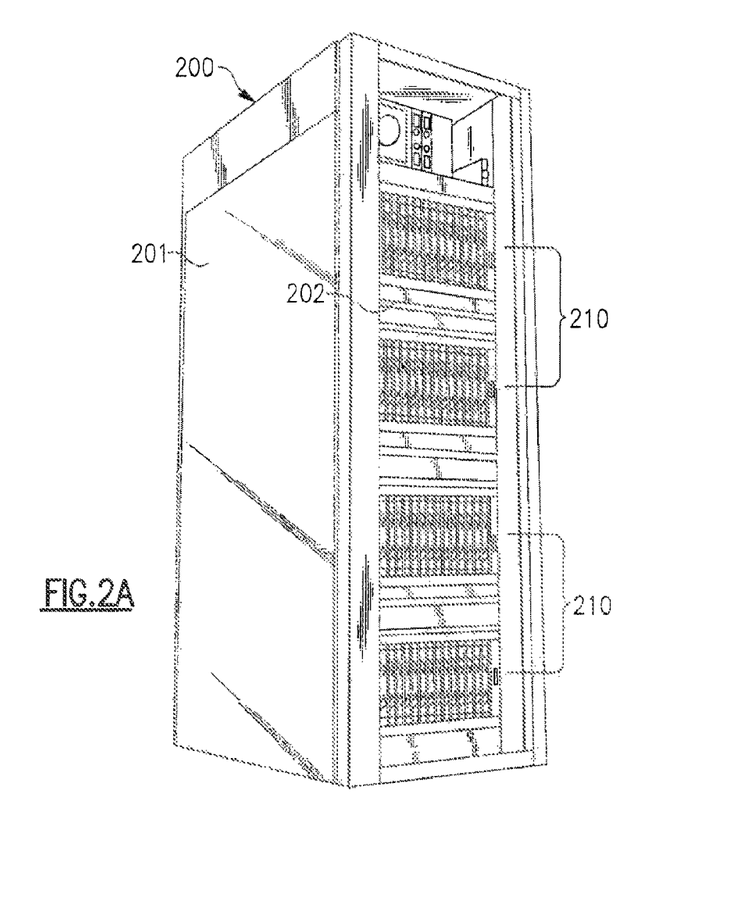
FIG. 2A is a side view illustration of a computer housing having a rack frame.

FIG. 2A is a perspective view illustration of a computer environment comprising of a housing 200, having a frame 202, preferably with a rack or cage like structure as shown. The housing 200 can also incorporate full or partial doors or covers such as referenced by numerals 201.

It should be noted that as used herein, the term computer or electronic rack 202, hereinafter will be used for ease of reference but can be construed to include any housing, frame, rack, compartment, blade server system or other structural arrangements including any that may incorporate doors and/or covers. In addition, the computer rack 202 can be either a stand alone computer processor or a sophisticated system, having high, mid or low end processing capability.

In one embodiment, an electronics rack may comprise multiple electronic system chassis, each having one or more heat generating electronics systems disposed therein requiring cooling. In different embodiments, an electronic system chassis may be a multi-blade center system 210 with each blade being removable and stackable inside the rack 202. In one example, one or more blades of a multi-blade center system are immersion cooled blades. "Immersion cooled electronic system" or "immersion cooled blade" refers to any system, blade, book, node or other similar notions as known to those skilled in the art, having multiple different types of electronic components thereof directly cooled by common immersion within coolant flowing around, over, through or across the electronic components. In one instance, one or more surfaces of each electronic component of the multiple different types of electronic components is in direct physical contact with the coolant to facilitate transfer of heat from the electronic component to the coolant.

Examples of a liquid cooled electronics rack employing immersion cooled electronic systems are described in co-filed commonly assigned U.S. patent applications entitled "Liquid Cooling Apparatus and Method for Cooling Blades of an Electronic System Chassis", Ser. No. 12/256,623 (published Apr. 29, 2010, as U.S. Patent Publication No. 2010/0101765 A1); "Apparatus and Method for Facilitating Pumped Immersion-Cooling of an Electronic Subsystem, Ser. No. 12/256,628 (published Apr. 29, 2010, as U.S. Patent Publication No. 2010/0103618 A1); and "Apparatus and Method for Immersion-Cooling of an Electronic System Utilizing Coolant Jet Impingement and Coolant Wash Flow, Ser. No. 12/256,631 (published Apr. 29, 2010, as U.S. Patent Publication No. 2010/0103614 A1), while one detailed example of an immersion-cooled blade is described and depicted in co-filed, commonly assigned U.S. patent application entitled "Apparatus and Method for Facilitating Immersion-Cooling of an Electronics Subsystem", Ser. No. 12/256,618 (published Apr. 29, 2010, as U.S. Patent Publication No. 2010/0101759 A1), the entirety of each is hereby incorporated herein by reference. Multiple components of an immersion cooled electronic system may be directly immersion cooled by the coolant or indirectly immersion cooled. Indirect immersion cooling refers to the existence of a thermal cap, thermal spreader, passivation layer, or other surface interposed between one surface of the component and the coolant within which the component is immersed. Direct immersion cooling of the component means that the coolant flows over multiple surfaces of the component.

Referring back to FIG. 2A, in this example, the electronic rack 202 comprises a stack of electronic system chassis or multi-blade center systems 210, as well as supporting power supplies, networking equipment and other similar and necessary components, not individually illustrated.

Figure 2B:
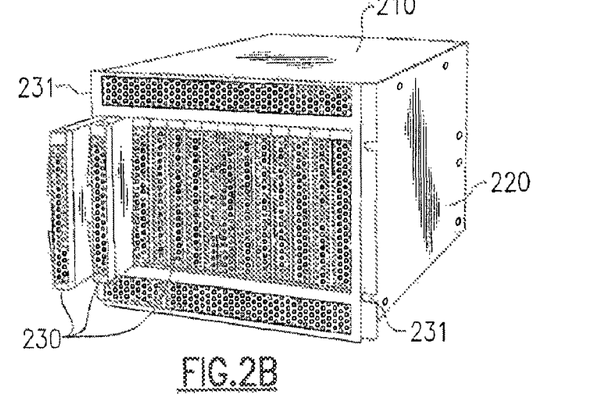
FIGS. 2B & 2C are perspective view illustrations of computing environment using removable subsystems and nodes such as blade systems.
Figure 2C:
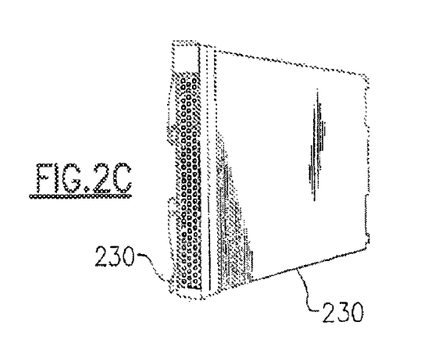

FIG. 2B, shows a perspective view of a multi-blade center 210, such as shown in FIG. 2A, one example of which is marketed by International Business Machines Corporation, of Armonk, N.Y. By way of specific example, multi-blade system 210 may comprise a stand alone server system which incorporates scalable computing functionality up to, for example, fourteen high performance blades. In some embodiments the system can include multiple removable blades 230 and system chassis 220. As one example, each removable blade 230 is an electronics system, such as a server of a multi-server electronics system. Flanges 231 are also provided that can be used to secure the blade system within an electronics rack as in FIG. 2A. FIG. 2C provides a perspective view of one such removable blade 230.

Figure 2D:
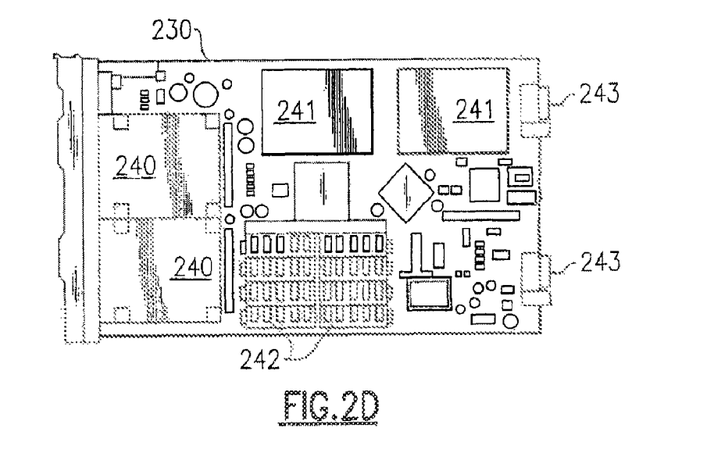
FIG. 2D is a schematic illustration of electronic components disposed in a liquid tight enclosure.

FIG. 2D is a schematic illustration of a liquid tight package with electronic components, such as the blade system 230 discussed in conjunction with FIGS. 2B and 2C. In this figure each package or blade can include multiple processors and can be a complete computer system having systems and/or subsystems that can include Direct Access Storage Devices (DASDs) 241 and Dual In-Line Memory Modules (DIMMs) 242. Corresponding electrical connectors 243 can be provided connecting these blades 230 to respective electronic system chassis 220 in FIG. 2B. These connectors are typically disposed near the back of the chassis for making electrical connection to connectors when the blade is inserted into the chassis in operational position. In some embodiments, cooling units such as heat sinks 240 can also be disposed within each removable blade 230 for cooling high heat flux components such as processor modules.

Advantageously, liquid cooling of a multi-blade center system, or an electronics rack provides increased cooling at the module and rack level, and enables higher performance systems than currently feasible using air cooling. Further, a liquid cooling apparatus and any method thereof, as will be discussed later by implementation of various embodiments of the present invention, improves energy efficiency by eliminating or reducing requirements on one or more data center air-conditioning units. With an immersion cooling approach, conventional air-moving devices within the multi-blade center system and the electronic(s) rack are eliminated, thereby reducing acoustic noise within the data center. Additionally, a reduced form factor of the processor's thermal solution is provided, thus allowing more functionality to be packaged within a single system or blade. This added functionality could be memory, hard drives, or other devices, which would allow for a more competitive offering within the marketplace.

A number of liquid coolants can be used in connection with the present invention as will be discussed below. Some examples will be enumerated below with the understanding that this is not an exhaustive list and many other examples can be used as known to those skilled in the art. One example of a liquid coolant could be water, and more specifically facility-chilled water. Other examples may comprise a fluorocarbon or segregated hydrofluoro ether liquid such as FC-86, FC-87, FC-72, HFE-7000, HFE-7100, or HFE-7200 (each of which is available from 3M Corporation, St. Paul Minn.). Fluorocarbon liquid typically boils at 30° C.-80° C. at atmospheric pressure, while water boils at 100° C. Those skilled in the art should note, however, that the concepts disclosed herein, as stated earlier, are readily adapted to other types of coolant. For example, one or more of the coolants may comprise brine, liquid metal, or similar coolant or refrigerant, while still maintaining various advantages and unique features of the present invention.

Figure 3:
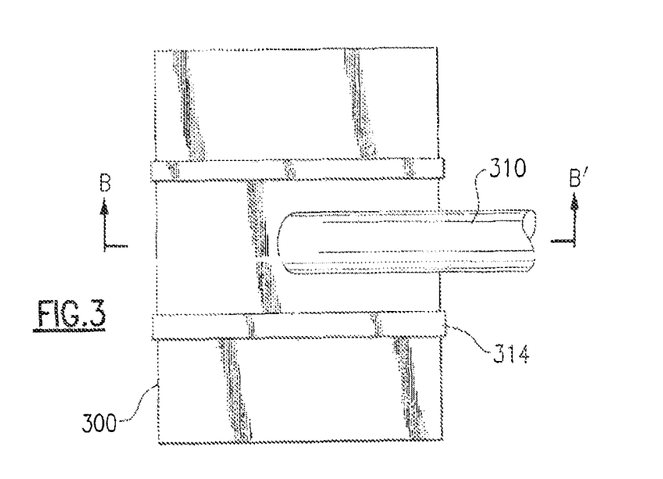
FIG. 3 is a top down illustration of one embodiment of the present invention providing direct liquid cooling.
Figure 4A:
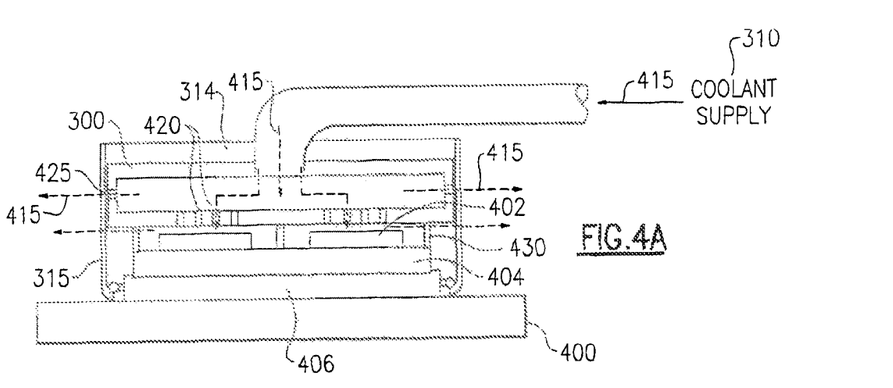
FIG. 4A is a cross-sectional elevation view of the assembly of FIG. 3 taken along the line B-B'.
Figure 4B:
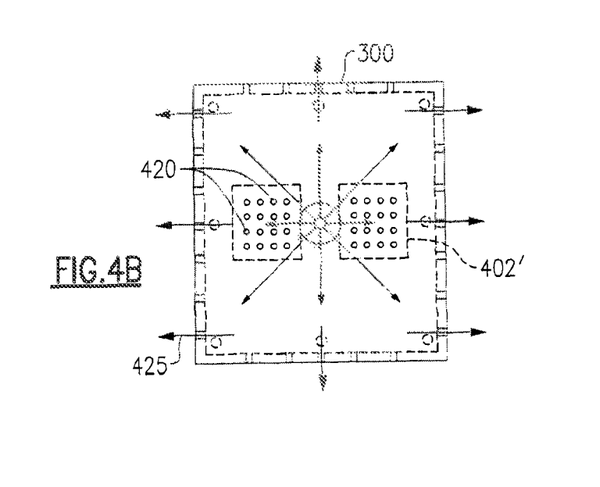
FIG. 4B illustrates a top view of the direct liquid cooled system discussed in conjunction with embodiments of FIGS. 3 and 4A.

FIGS. 3, 4A and 4B provide alternatively top down and cross sectional views of one embodiment of the present invention providing a direct liquid cooling technique. An open flow cold plate 300, enabled for cooling of electronic components using a totally liquid cooled package enclosure is provided. More specifically, the top down illustration of FIG. 3 provides an open flow cold plate 300 with features that provide liquid jet cooling on electronic components. These features are especially effective for cooling of high powered processor chips included in sophisticated computing system environments.

In the embodiment of FIGS. 3, 4A and 4B, the chips will be attached to a substrate (404 in FIG. 4A) to which the open flow cold plate 300 will also be secured. In a preferred embodiment the cold plate 300 will be secured to the substrate via mechanical means as known to those skilled in the art but other means can be used in alternate embodiments. For example, in a preferred embodiment, a mechanical clamp 315 including tie down bar(s) 314 can be provided for securing the cold plate further to one or more surfaces of the substrate. Coolant, preferably cooling liquid is supplied to the cold plate 300 via a closed coolant conduit. The coolant conduit is referenced as 310 in FIG. 3 and is enabled to provide coolant such as from a supply to the cold plate 300.

FIG. 4A is a cross-sectional elevation view of the assembly of FIG. 3 taken along the line B-B'. This view provides design elements that are not clearly visible in FIG. 3. As mentioned, coolant or cooling liquid is provided through coolant conduit 310. The open flow plate 300, however, does not provide a closed circuit loop and is partially open. Therefore, the coolant supplied to the cold plate does not exit the cold plate in a closed loop, such as in the case of indirect liquid cooling methods. Instead, the coolant here exits the cold plate through ports and orifices provided in the cold plate 300, as will be later discussed, providing direct impingement cooling to the high heat flux component to which it is attached and providing coolant flow for other immersed components.

As indicated by arrows, referenced by numerals 415, coolant (from a supply) can be provided to the cold plate assembly. Some of the liquid in the cold plate 300 exits as jets through orifices 420 disposed on the bottom surface of the cold plate 300 to directly cool the high powered chips or other electronic components. As shown, the bottom surface of the cold plate 300 is placed in thermal contact with a processor chip 402 which is mounted on substrate 404, said substrate is electrically and mechanically connected to printed circuit board 400 via processor module connector 406. As shown in the figure, in one embodiment of the present invention, the mechanical clamp 315 can be used to connect and secure the cold plate to the substrate. The clamp, in one embodiment, comprises tie down bars 314 as shown.

Some of the coolant provided does not exit through the orifices disposed on the cold plate bottom surface, but instead through one or more ports 425 disposed on one or more side surfaces adjacent to the bottom surface. In a preferred embodiment, ports are provided on both opposing side surfaces as shown. The amount of coolant exiting side ports and as jet through orifice(s) on the bottom, may be selectively controlled by adjusting the size, placement or numbers of ports/orifices provided on each surface.

In addition, the distance between the jet orifice openings and ports, when more than one port/orifice is provided, can also be selectively designed to enhance or reduce the flow. It is also possible to only include one or a plurality of ports or orifices on one or more surfaces. In this embodiment, a plurality of ports are provided on opposing sides and adjacent to the bottom surface of the cold plate 300.

In one embodiment, this distance between the jet orifice openings and the back surface of the chips or other electronic components is also controlled by means of providing one or more stand-offs, preferably mechanical stand-offs 430. In a preferred embodiment, these stand-offs are situated between the substrate's top surface and the cold plate bottom surface as shown to ensure focused cooling from all ports/orifices. Please note that in FIG. 4A, for ease of understanding, the flow of coolants are shown by way of example through arrows enumerated by numerals 415.

FIG. 4B is a top view illustration of the embodiments discussed in FIGS. 3 and 4A. As shown, the coolant liquid enters the top of the open cold plate 300 via the coolant conduit (not visible in this figure). The coolant then disperses as shown in the direction of the arrows. As these arrows indicate, the coolant flows radially outward but within the cold plate 300 and exits as jets through the orifices 420 and/or through the effluent flow from the side walls through ports 425. An outline of the chip(s), or other electronic component(s), is also provided as referenced by 402'.

Figure 5:
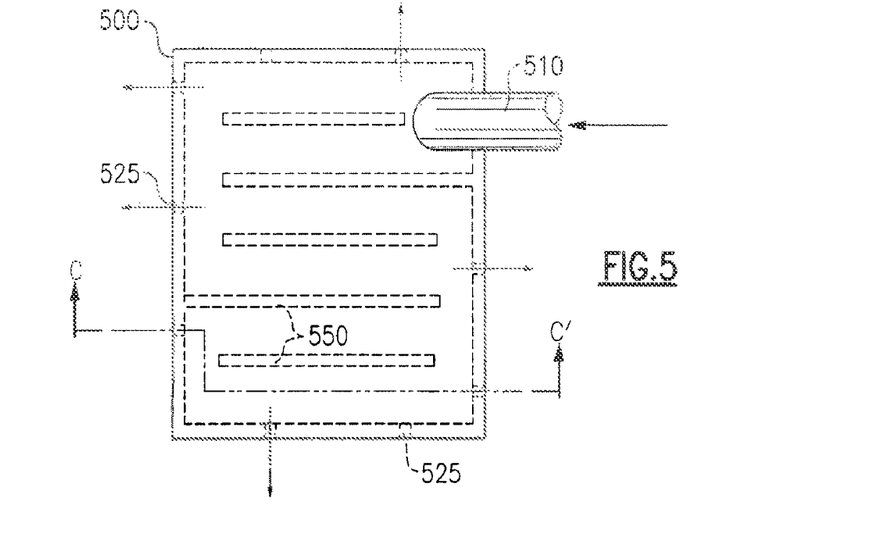
FIG. 5 is a top-down illustration of an alternate embodiment of the present invention providing both direct and indirect liquid cooling.

FIG. 5 is a top-down illustration of an alternate embodiment of the present invention utilizing both direct and indirect liquid cooling techniques at the same time. In this embodiment, the open flow cold plate is referenced as 500. Cold plate 500 has one or more openings or ports on one or more side surface(s) of cold plate 500. These ports are referenced by numerals 525 as shown. The underside or bottom surface of the cold plate 500, however, does not have orifice(s) as before.

The bottom surface of the cold plate 500, in this embodiment is in direct contact with the back surfaces of the chip(s)

or electronic component(s). A plurality of ribs or alternatively cooling fins (or the like) are also provided internally in the cold plate 500 and referenced as 550. The fins are cooled by circulating coolant as shown. The coolant in this embodiment is provided through a conduit 510 that is closed to direct coolant into flow passages defined by the fin structure within the cold plate.

Cooling of the electronic components in this embodiment is accomplished both via thermal conduction, and direct liquid cooling. The heat conduction is across the chip-cold plate interface and is transferred from the electronic components into the cold plate bottom or base plate 540 (FIG. 6), and then into the fins 550. This constitutes the indirect liquid cooling portion that is provided by cold plate 500.

The coolant provided by the coolant supply after circulating through the fins, will then be discharged from the cold plate 500 into the surrounding areas via the side ports or orifices 525 and will also provide direct immersion cooling to the electronic components outside of the processor module. The direction of coolant flow after it is supplied to the cold plate is indicated by arrows.

Figure 6:
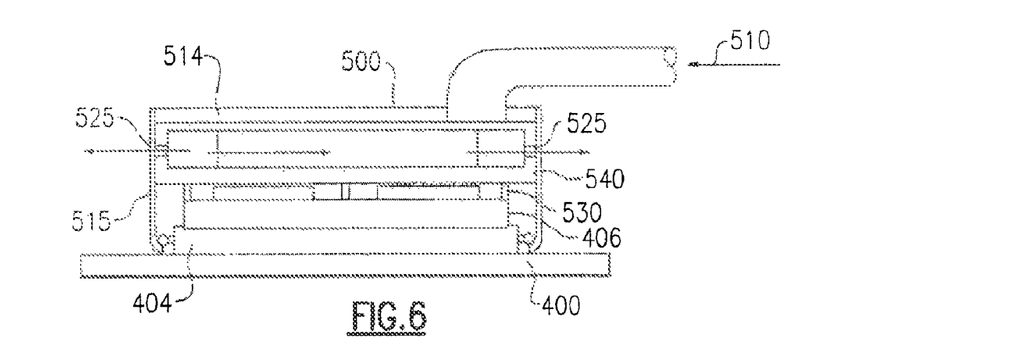
FIG. 6 is a cross-sectional elevation view of the assembly of FIG. 5 taken along the line C-C'.

FIG. 6 is a cross-sectional elevation view of the assembly of FIG. 5 taken along the line C-C'. This view provides design elements that are not clearly visible in FIG. 5. As before, flow of coolant is indicated by arrows shown. In this embodiment, the coolant first enters the internal fins before exiting through the effluent flow ports 525 on the sides as discussed.

Cold plate 500 can be secured to the circuit board 400 as before in a variety of ways. In this embodiment, a horizontal tie down bar 514 is alternatively provided. As before, mechanical standoffs 530 can also be used and adjusted to separate the cold plate 500 from the processor module. Clamps 515 secure the cold plate to module 406 and board 400 via connector 404.

It should also be noted that as before, it is possible to only include one or a plurality of ports or more side surfaces as discussed. In this embodiment, a plurality of ports are provided on opposing sides and adjacent to the bottom surface as discussed.

Figure 7:
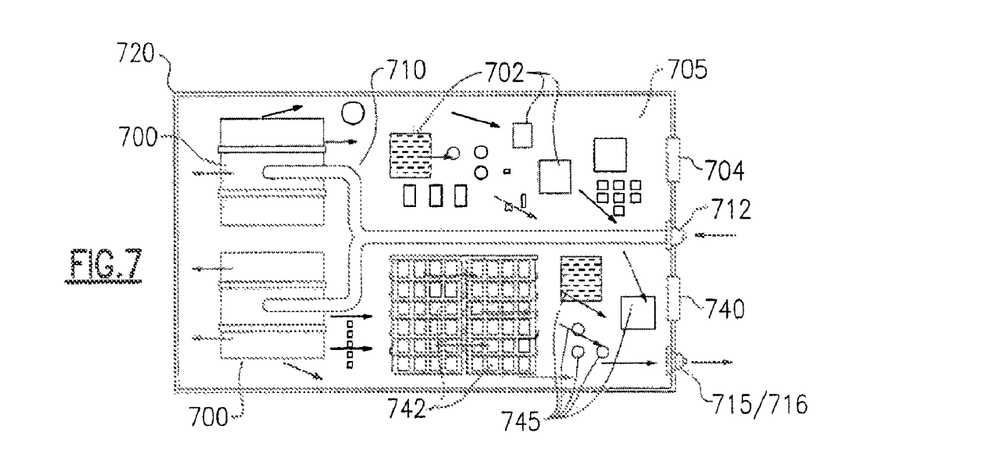
FIG. 7 is a schematic illustration of a computing environment using direct cooling as provided by embodiments discussed in conjunction with FIG. 3 or alternatively FIG. 5.

FIG. 7 is a schematic illustration of one embodiment of the present invention where one or more open flow cold plate 700, is provided in a liquid tight package enclosure to cool electronic components. In this figure, two open flow cold plates 700 are used. It is possible, however, to use just one or a plurality of cold plates in other embodiments. The cold plates can be of the same or different types and may encompass one or both types of cold plates (300 or 500) as discussed in conjunction with FIG. 3 or alternatively FIGS. 5 and 6. In this figure, by way of example, a computing system environment is shown that encompasses a liquid tight package enclosure such, as the blade system discussed in FIGS. 2A through 2D. In this embodiment, the package enclosures (i.e. blade system(s) are housed in an electronics rack) are disposed in a liquid tight enclosure 720. In addition, a variety of heat generating electronic components are disposed on the printed circuit board 705 as shown in the figure. These components can include low power components 702 and power connectors 704 (not necessarily on the circuit board 705). Other heat generating components such as DIMM packages 742 or signal connectors 740 or generally other components 745 can also be included.

The coolant is provided from a supply in the direction of the arrow referenced by numerals 712. As shown, the coolant is distributed by coolant conduit 710. In a preferred embodiment, coolant in the form of a liquid can be supplied to the open flow cold plate(s) through a coolant conduit within the enclosure and the conduit is connected to the coolant source via piping external to the enclosure by means of a quick disconnect coupling 714. Since there is a plurality of cold plates 700 in this embodiment, the piping is designed to provide coolant to both cold plates 700. The coolant flows through the open flow cold plate and then is expelled into the surrounding open space within the liquid tight enclosure as indicated by the arrows. As the liquid returns to exit port 715, it flows over other heated components and provides the necessary cooling either by way of direct cooling or through a combination of direct and indirect liquid cooling techniques. The coolant exit port connects to external piping, in one embodiment, via a quick disconnect coupling 716.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A cooling apparatus for cooling an electronic system, the cooling apparatus comprising:
   a liquid-tight enclosure facilitating providing immersion-cooling of the electronic system;
   an open flow cold plate disposed within the liquid-tight enclosure, the open flow cold plate being associated with the electronic system and having a coolant conduit, the coolant conduit enabled for supplying coolant to the open flow cold plate;
   wherein the open flow cold plate comprises a bottom surface coupled to an electronic component of the electronic system for convective heat transfer therefrom, and at least one open port on a side surface thereof, wherein coolant supplied to the open flow cold plate flows out from the open flow cold plate through the at least one open port on the side surface into the liquid-tight enclosure to provide immersion-cooling through coolant-effluent flow emanating from the open flow cold plate to cool additional electronic components of the electronic system disposed in the liquid-tight enclosure.

2. The cooling apparatus of claim 1, wherein the electronic component coupled to the bottom surface of the open flow cold plate is disposed on a printed circuit board comprising a substrate.

3. The cooling apparatus of claim 2, wherein the open flow cold plate is secured to the printed circuit board via a securing means.

4. The cooling apparatus of claim 3, wherein the securing means comprises a tied-down mechanical clamp.

5. The cooling apparatus of claim 1, wherein the coolant comprises dielectric coolant.

6. The cooling apparatus of claim 1, wherein a plurality of stand-offs control a distance between the bottom surface of the open flow cold plate and a surface of the electronic component coupled thereto.

7. The cooling apparatus of claim 1, wherein the open flow cold plate comprises a plurality of open ports, at least two open ports of the plurality of open ports being disposed on opposing sides of the open flow cold plate, adjacent to the bottom surface of the open flow cold plate.

8. The cooling apparatus of claim 7, wherein number and size of the plurality of open ports are selected to control an amount of coolant flow out of the open flow cold plate into the liquid-tight enclosure for immersion-cooling of the additional electronic components of the electronic system.

9. The cooling apparatus of claim 1, wherein the bottom surface of the open flow cold plate is solid.

10. The cooling apparatus of claim 1, wherein the open flow cold plate further comprises a plurality of internal fins and coolant discharges from the open flow cold plate through the at least one open port on the side surface thereof into the liquid-tight enclosure to provide immersion-cooling to the additional electronic components of the electronic system.

11. A method of cooling a plurality of electronic components comprising:
  disposing the plurality of electronic components in a liquid-tight enclosure;
  disposing an open flow cold plate in the liquid-tight enclosure to provide cooling for an electronic component of the plurality of electronic components, the disposing comprising coupling a surface of the open flow cold plate to the electronic component of the plurality of electronic components to facilitate cooling of the electronic component;
  providing coolant from a coolant supply via a coolant conduit to the open flow cold plate; and
  immersion-cooling additional electronic components of the plurality of electronic components, wherein the open flow cold plate includes at least one open port on a side surface thereof such that coolant provided to the open flow cold plate flows out of the open flow cold plate through the at least one open port on the side surface thereof to facilitate the immersion-cooling through cooling-effluent flow emanating from the open flow cold plate to the additional electronic components of the plurality of electronic components disposed within the liquid-tight enclosure.

12. The method of claim 11, wherein the coupling comprises coupling a bottom surface of the open flow cold plate to the electronic component, and wherein the electronic component is disposed on a printed circuit board comprising a substrate.

13. The method of claim 12, further comprising securing the open flow cold plate to the printed circuit board via a securing means.

14. The method of claim 13, wherein the securing means comprises a tied-down mechanical clamp.

15. The method of claim 11, wherein the coolant comprises dielectric coolant.

16. The method of claim 11, further comprising providing a plurality of stand-offs to control a distance between a surface of the open flow cold plate and a surface of the electronic component coupled thereto.

17. The method of claim 11, wherein the open flow cold plate comprises a plurality of open ports, at least two open ports of the plurality of open ports being disposed on opposing side surfaces of the open flow cold plate, adjacent to the surface of the open flow cold plate coupled to the electronic component.

18. The method of claim 17, wherein number and size of the plurality of open ports are selected to control an amount of coolant flow out of the open flow cold plate into the liquid-tight enclosure for immersion-cooling of the additional electronic components of the plurality of electronic components disposed within the liquid-tight enclosure.

19. The method of claim 11, wherein the surface of the open flow cold plate coupled to the electronic component is a solid surface of the open flow cold plate.

20. The method of claim 11, wherein the open flow cold plate further comprises a plurality of internal fins and coolant discharges from the open flow cold plate through the at least one open port on the side surface thereon into the liquid-tight enclosure to provide the immersion-cooling of the additional electronic components of the plurality of electronic components disposed within the liquid-tight enclosure.

* * * * *